United States Patent [19]
Wilhelm et al.

[11] Patent Number: 4,823,030
[45] Date of Patent: Apr. 18, 1989

[54] ECL LOGIC GATE USING MULTI-EMITTER TRANSISTORS

[75] Inventors: Wilhelm Wilhelm; Karl-Reinhard Schön, both of Munich, Fed. Rep. of Germany

[73] Assignee: Siemens Aktiengesellschaft, Berlin and Munich, Fed. Rep. of Germany

[21] Appl. No.: 144,588

[22] Filed: Jan. 6, 1988

Related U.S. Application Data
[63] Continuation-in-part of Ser. No. 779,653, Sep. 24, 1985.

[30] Foreign Application Priority Data
Sep. 24, 1984 [DE] Fed. Rep. of Germany ....... 3435048

[51] Int. Cl.$^4$ ......................................... H03K 19/086
[52] U.S. Cl. ................................... 307/455; 307/443; 307/291; 307/299.2
[58] Field of Search ............... 307/443, 454, 455, 456, 307/243, 272 A, 291, 299 A

[56] References Cited

U.S. PATENT DOCUMENTS

| | | | |
|---|---|---|---|
| 3,519,810 | 7/1970 | Priel et al. | 307/455 X |
| 3,649,844 | 3/1972 | Kroos | 307/455 X |
| 4,007,384 | 2/1977 | Brooks | 307/455 |
| 4,349,753 | 9/1982 | Scavuzzo | 307/455 X |
| 4,354,266 | 10/1982 | Cooperman et al. | 307/243 X |
| 4,394,657 | 7/1983 | Isogai et al. | 307/463 X |
| 4,506,171 | 3/1985 | Evans et al. | 307/455 X |
| 4,540,900 | 9/1985 | Early et al. | 307/455 X |

FOREIGN PATENT DOCUMENTS
0035326 2/1981 European Pat. Off. .
5516488 9/1982 Japan .

OTHER PUBLICATIONS
Braeckelman et al, "A Masterslice LSI for Subnanosecond Random Logic", ISSCC, Feb. 16-18, 1977, Philadelphia, PA., pp. 108-109.

*Primary Examiner*—David Hudspeth
*Attorney, Agent, or Firm*—Herbert L. Lerner; Laurence A. Greenberg

[57] ABSTRACT

A semiconductor circuit arrangement in ECL technology having logical conjunctions between more than two input variables, includes two series-gating stages having ECL current switches, which are controlled by an input variable, each including a reference circuit and at least one control circuit, at least one threshold voltage diode for separating at least two of the logical junctions from one another, further comprising a multiemitter transistor included in the control circuit of the ECL current switch forming the reference circuit, at least one diode-connected transistor having at least two emitters and one collector resistor which forms a logical conjunction of the signal present at the emitters of the diode-connected transistor.

10 Claims, 2 Drawing Sheets

ECL LOGIC GATE USING MULTI-EMITTER TRANSISTORS

This application is a continuation of application Ser. No. 779,653, filed Sept. 24, 1985.

BACKGROUND AND PRIOR ART

The present invention relates to the realization of AND logic circuits in emitter-coupled logic circuits (ECL).

ECL logic modules are distinguished by particularly high speed because there is no saturation of the transistors. The principle of the circuit is that a constant emitter current is fed into a differential amplifier and the base of the first of the transistors has a bias between a low and a high level. Depending on the potential of the base of the second transistor, the latter or the first transistor takes over the current which causes a voltage drop determining the output condition at the associated collector resistor. AND logic arrangements can be realized very simply by series-gating, wherein several such stages lie on top of each other, i.e., the collectors of the lowest level plane are respectively connected to the emitters of the differential stage belonging to the next-higher potential plane, and only the topmost plane has collector resistors. In OR gates, the collectors of the topmost potential plane lead to a node and from there to the collector resistor.

The number of input variables in AND logic circuits is limited by the number of possible series gating stages, the levels of which differ by a diode voltage each. To assure sufficient signal excursion, a maximum of three stages can be on top of each other with supply voltages of 4.5 to 5.2 V, taking the required current sources into consideration.

According to the state of the art, more than three input variables in an AND gate are realized by connecting in series several series-gating gates, in which respective partial interconnections are carried out. From three input variables, an (auxiliary) output signal is generated which addresses an input of the next-following gate. Four input variables, for instance, require three series-gating stages of the first and two stages of the second gate as is shown in FIG. 1 by the example of a circuit of a 4-bit multiplexer with latching.

The logic function belonging to the circuit example of FIG. 1 reads:

$$Q(t) = A \cdot B \cdot C \cdot D1 + A \cdot \overline{B} \cdot C \cdot D2 + \overline{A} \cdot B \cdot C \cdot D3 + \overline{A} \cdot \overline{B} \cdot C \cdot D4 + Q(t-1) \cdot \overline{C}.$$

The maximally four input variables of the AND gates require two series-connected series-gating gates. The first gate realizes the logic function $M = A \cdot B \cdot D1 + A \cdot \overline{B} \cdot D2 + \overline{A} \cdot B \cdot D3 + \overline{A} \cdot \overline{B} \cdot D4$ and the second gate, the logic function $Q(t) = M \cdot C + Q(t-1) \cdot \overline{C}$. On the lowest level plane VSI there are constant-current sources I1 to I7, with their emitter resistors RI1 to RI7, supplying the circuit. The two differential amplifiers DA and DC of the lowest series-gating stage with the base bias VB3 are controlled by the emitter followers TA and TC and their inputs A and C. The diodes DIA and DIC serve for matching the level to the next-higher stage with a bias VB2 for the differential stages DB1, DB2, DM and DQ(t−1) which are controlled by the emitter followers TB, TM and T1Q(t−1) with the inputs B and M and, in connection with the series base resistor RE3, by Q. Superimposed on this plane is the third series gating stage with the differential amplifiers DE1 to DE4 and the inputs D1 to D4. The corresponding bias VB1 is present at the bases of the two-emitter transistors, the collectors of which are tied together and form an OR logic circuit in conjunction with the common collector resistor RE1. Its collector potential controls the input M of the second series-gating gate via the transistor TM. The gate is connected in series and the output states Q and $\overline{Q}$ of the gate are present at the collectors of the differential stages DM and DQ(t−1) and the load resistors RE2, RE4 and RE5 of the differential stages DM and DQ (t−1) form the output of the circuit.

A disadvantage of this method are the relative long gate propagation times which depend on the number of the series-gating stages to be traversed. The gate propagation times are, for instance, for the circuit according to FIG. 1, typically, for the signal Di after Q, 1.07 ns, for A after Q, 1.33 ns and for B after Q, 1.20 ns; the relatively large amount of power required due to the large amount of circuitry, and the frequently not optimal utilization of the series-gating stages.

It is an object of the invention to further increase, by circuitry measures having only two series-gating stages, the number of the input variables, and to shorten the signal propagation time.

SUMMARY OF THE INVENTION

According to the invention, this problem is solved in an arrangement of the type mentioned at the outset wherein a semiconductor circuit arrangement in ECL technology for realizing logical conjunctions between more than two input variables, having two series-gating stages in which ECL current switches which are each controlled by an input variable, and each contains a reference circuit and at least one control circuit which result in logical conjunctions if connected in series and separated from each other by at least one diode threshold voltage. It is characterized by the feature that, in the control circuit of an ECL current switch having a multiple-emitter transistor which forms the reference circuit, a diode-connected transistor having at least two emitters and one collector resistor, are contained which forms a logical conjunction of the signals present at the emitters of the transistor which is connected as a diode.

In another embodiment the input variables are divided into addressing signals and data signals.

In still another embodiment the input variables are arranged to address the topmost voltage level of the arrangement.

In still another embodiment emitter followers are included between the addressing signals and the control circuits.

In still another embodiment at least two ECL current switches are included in the series-gating stage which are controlled by the input variables.

In still another embodiment at least one of the control circuits for the ECL switches includes a transistor connected as a diode.

In still another embodiment, a reference circuit or a control circuit of the ECL switches includes at least one multi-emitter transistor.

In still another embodiment resistors are included in the circuit arrangement, which form logical cunjunctions between the address signals, the data signals and signals which depend therefrom.

In still another embodiment a logical conjunction is provided between the input variables, which includes two transistors that are series connected and controlled by the input variables at their base, and a control transistor of an ECL current switch and a collector-base path connected between the connected emitters of the ECL current switch and the free emitter not connected to the base of the ECL current switch of that transistor which is directly or indirectly controlled by an input variable of a control circuit belonging to another ECL current switch.

In still another embodiment, one of the transistors indirectly or directly controlled by the input variables is addressed by a signal formed by the voltage addition at a resistor from a signal dependent on the output signal of a series-gating stage and an input variable.

In still another embodiment resistors are included in the circuit arrangement which serve for matching voltage levels internally to the circuit.

Further embodiments of the idea of the invention defined above are characterized in the claims.

The invention will be explained in greater detail in the following, in reference to an embodiment example.

Other features which are considered as characteristic for the invention are set forth in the appended claims.

Although the invention is illustrated and described herein as embodied in AND gates for ECL circuits, it is nevertheless not intended to be limited to the details shown, since various modifications and structural changes may be made therein without departing from the spirit of the invention and within the scope and range of equivalents of the claims.

BRIEF DESCRIPTION OF THE DRAWING

The construction and method of operation of the invention, however, together with additional objects and advantages thereof will be best understood from the following description of specific embodiments when read in connection with the accompanying drawings, in which.

DESCRIPTION OF THE PREFERRED EMBODIMENTS

Figure 1:
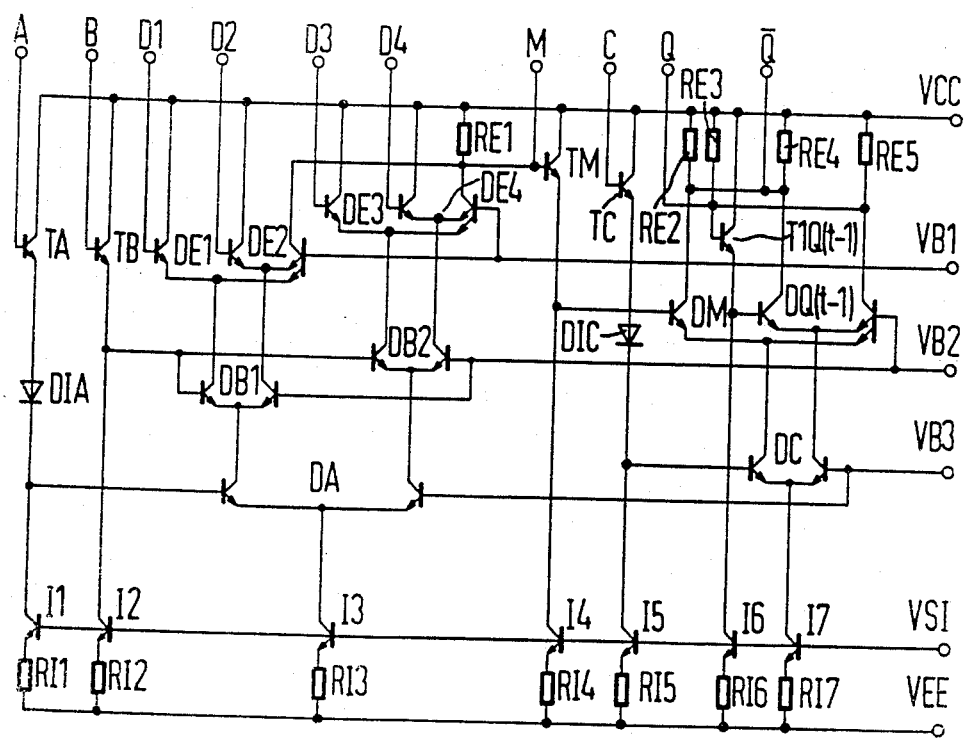
FIG. 1 shows the prior art.
Figure 2:
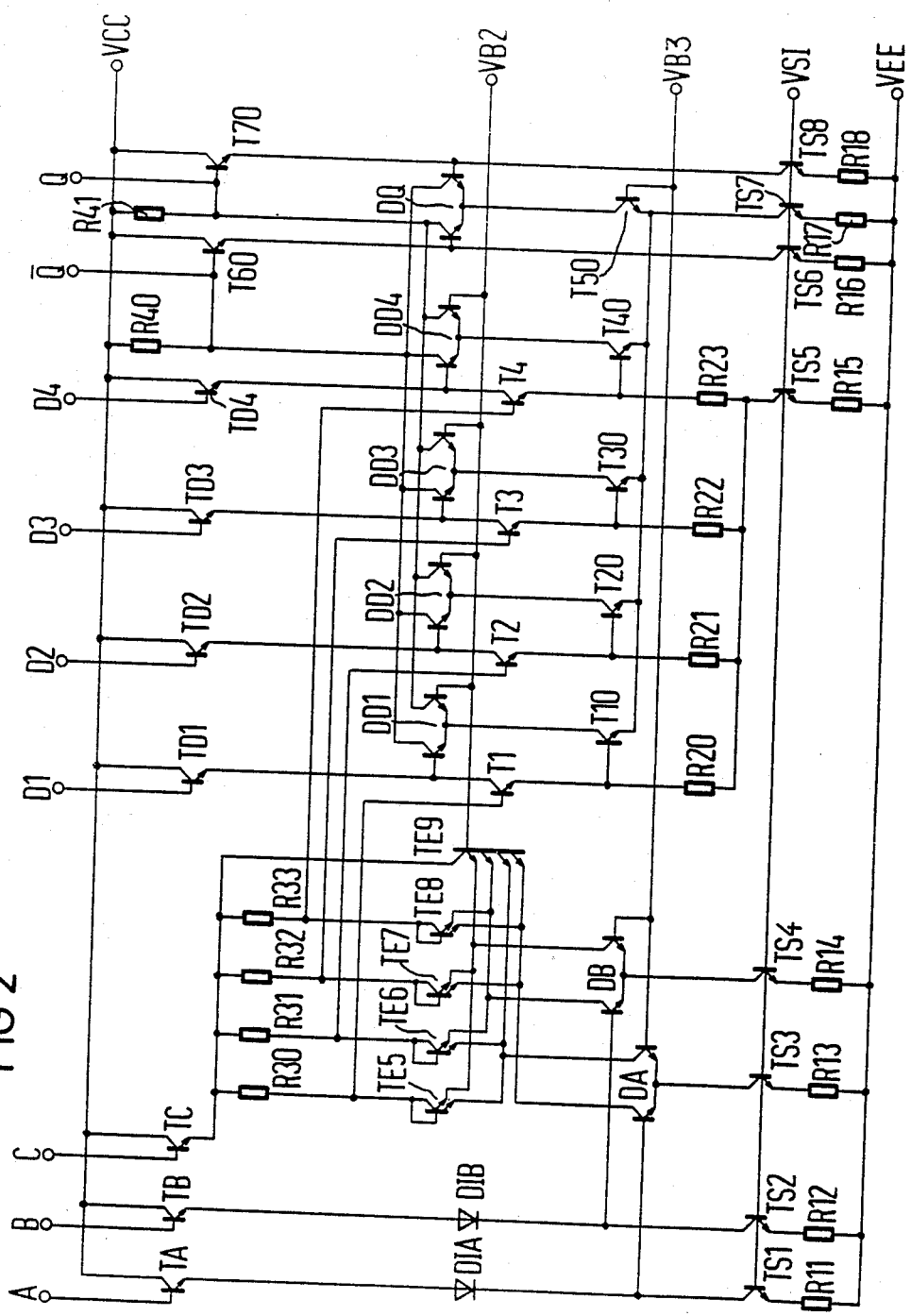
FIG. 2 shows a circuit with the same logical function and the same reference symbols as in FIG. 1 but having only two series-gating stages.

The example shown in FIG. 2 of a circuit realization according to the invention having the same logic function as in FIG. 1 requires only two series-gating stages and makes possible a larger signal excursion and greater interference security connected therewith.

The circuit according to FIG. 2 is supplied by eight current sources each of which comprises a transistor TS1 to TS8 controlled by the common base voltage VSI and a corresponding emitter resistor R11 to R18, the respective free terminal of which is connected to the terminal VEE of the supply voltage source.

The two differential amplifiers DA and DB which have the base bias VB3 and are controlled by the input emitter followers TA and TB with their input signals A and B via the diodes DIA and DIB serving for matching the levels, are located on the next-higher level plane. At the respectively connected emitters of DA and DB are connected the collectors of the current source transistors TS3 and TS4; at the bases of the transistors or the cathodes of DIA and DIB not biased by VB3 are connected the collectors of the current source transistors TS1 and TS2.

On the same level plane there are the current-switching transistors T10 to T50, the emitters of which are all connected together and to the collector of TS7. The base of the control transistors T10 to T40 which cause the logical connection of the addressing signals A, B and C to the data signals D1 to D4 are connected via the associated potential-determining resistors R20 to R23 to the collector of the current source transistor TS5 and are addressed by the emitter followers T1 to T4 arranged on the level plane in the middle. The reference transistor T50 biased by the series-gating voltage VB3 is responsible for the inverse control signal $\overline{C}$ of a latch.

On the next-higher level plane, which at the same time forms the upper series-gating stage, the logical connection of the input signals A, B and C is carried out. The AND relationships between the signals A and B and their complementary signals is accomplished by means of a diode decoder circuit. The latter contains the two-emitter transistors TE5 to TE8 connected as diodes and the four-emitter transistor TE9, at the base of which the bias VB2 is present.

The first emitter of TE9 is connected to one emitter each of TE5 and TE7 as well as to the collector of the transistor of the ECL currents with DB, which is, biased by VB3 of the stage DB; the second emitter of TR9 is connected to one emitter each of TE6 and TE8 as well as to the collector of the transistor, addressed by the signal B of the differential ECL current switch DB; the third emitter of TE9 is connected to the second respective emitter of TE5 and TE6 as well as to the collector of the transistor of the differential amplifier DA biased by VB3 and finally, the remaining emitter of the decoder, i.e., the fourth emitter of TE9, and each second emitter of TE7 and TE8 and the collector of the transistor of current switch DA, addressed by the signal A, are tied together.

The outputs of the diode decoder circuit, i.e., the collectors of the two-emitter transistors TE5 to TE8 control the bases of the emitter follower transistors T1 to T4 and are connected via the resistors R30 to R33 to the output of the emitter follower TC addressed by the signal C. The emitter of TC is furthermore wired directly to the collector of the four-emitter transistor TE9.

The collectors of T1 to T4 are connected to the outputs of the emitter followers TD1 to TD4 controlled by the input signals D1 to D4 and to the bases of one each of the control transistors of the differential amplifier stages DD1 to DD4. To the base of every second transistor of DD1 to DD4 is applied the series-gating voltage VB2, while the emitters combined for each differential stage are connected to the collectors of T10 to T40.

The collectors of the transistors, biased by VB2, of the differential amplifiers DD1 to DD4, are combined with the collector of the first transistor of a further differential amplifier DQ and are connected via the resistor R41 to the pole VCC of the supply voltage source. The output signal Q can be taken off at the collectors, and also addresses the emitter follower T70 which is supplied with current from the collector of transistor TS8 and the output of which controls the second transistor of the further differential stage DQ. The collector of this second transistor of the differential stage DQ has, with the collectors of the control transistors, not biased by VB2 of the differential amplifiers DD1 to DD4, a common nodal point which leads via the resistor R40 to the pole VCC of the supply voltage source. At the so defined nodal point, the output signal $\overline{Q}$ can be taken off which controls the emitter follower T60 which is supplied with current from the collector of TS6 and the output if which addresses the first transistor of the further differential amplifier DQ. The common emitters of the differential stage DQ are connected to the collector of the transistor T50. The collectors of the emitter followers TA, TB, TC, TD1 to TD4, T60, and T70 are connected directly to the pole VCC of the supply voltage source.

The circuit according to the invention as per FIG. 2 achieves, as compared to the circuit realizing the same logic function with two serial series-gating gates according to FIG. 1, propagation times that are shorther by about 55% for the delay from $D_i$ to Q, by about 20% from A to Q and about 10% from B to Q.

The foregoing is a description corresponding in substance to German Application No. P 34 35 048.9, filed Sept. 24, 1984, the International priority of which is being claimed for the instant application, and which is hereby made part of this application. Any material discrepancies between the foregoing specification and the aforementioned corresponding German application are to be resolved in favor of the latter.

We claim:

1. A semiconductor circuit for forming logic functions in ECL technology, comprising first and second cascade-connected series-gating stages having respective first and second ECL current switches, said current switches having respective first and second control circuit each being controlled by at least two input variables, said current switches having respective first and second reference circuits connected to its corresponding control circuit, said first reference circuit having a multi-emitter transistor, said first control circuit having at least one diode-connected multi-emitter transistor connected at its collector to a resistor to form preliminary logic output signals as a logic function of the at least two input variables applied to the first control circuit.

2. Semiconductor circuit according to claim 1, wherein said input variables include addressing signals and data signals and their complementary signals.

3. Semiconductor circuit according to claim 2, wherein said second series-gating stage comprises a further ECL current switch cascade-connected to said second ECL current switch to form a series circuit across a circuit voltage supply, said second ECL current switch receiving a more positive operation potential than said further ECL current switch to form a highest gating level, and wherein said data signals are applied to drive said highest gating level.

4. Semiconductor circuit according to claim 2 including emitter followers, wherein the input variables are applied to the respective control circuits via the emitter followers.

5. Semiconductor circuit according to claim 2, including at least two ECL current switches included in at least one of the series-gating stage, each switch being controlled by an input variable.

6. Semiconductor circuit according to claim 5, including one of a diode-connected transistor and a diode included in at least one of the control circuits.

7. Semiconductor circuit according to claim 3, wherein said at least one diode-connected transistor and said collector resistor forms said preliminary logic output signals as a function of the addressing signals, and said addressing, data, and output signals have voltage levels at or below said highest gating level.

8. Semiconductor circuit according to claim 1 which includes at least a first and a second emitter-follower transistor being connected in series and being controlled by said input variables and said preliminary logic output signals applied to their respective bases, said second emitter-follower transistor being the current source of said first emitter-follower transistor, a control transistor of said second control circuit being connected to a junction point between said first and second emitter-follower transistors; said second series-gating stage having a further ECL current switch cascade-connected to said second ECL current switch, said further ECL current switch having a further control circuit having at least one further control transistor, the collector of said further control transistor being connected to the connected emitters of said transistors of the second ECL-current switch, and the base of said further control transistor being connected to the emitter of said second emitter-follower transistor.

9. Semiconductor circuit according to claim 8, wherein said preliminary logic output signals are generated by voltage addition at said collector resistor of a further one of said input variables and said at least two input variables.

10. Semiconductor circuit according to claim 9, including resistors connected for matching voltage levels internally to the circuit.

* * * * *